United States Patent [19]

Konuma et al.

[11] Patent Number: 5,747,355
[45] Date of Patent: May 5, 1998

[54] METHOD FOR PRODUCING A TRANSISTOR USING ANODIC OXIDATION

[75] Inventors: Toshimitsu Konuma; Akira Sugawara; Takahiro Tsuji, all of Kanagawa, Japan

[73] Assignee: Semiconductor Energy Laboratory Co., Ltd., Kanagawa-ken, Japan

[21] Appl. No.: 455,151

[22] Filed: May 31, 1995

Related U.S. Application Data

[62] Division of Ser. No. 219,378, Mar. 29, 1994, abandoned.

[30] Foreign Application Priority Data

Mar. 30, 1993  [JP]  Japan ................... 5-096667

[51] Int. Cl.[6] ................................................ H01L 21/786
[52] U.S. Cl. .......................... 437/41; 437/983; 205/124
[58] Field of Search ............................. 437/983, 41 GS, 437/40 GS, 41 TFT, 40 TFT, 236, 237, 21, 41 RLD; 205/124

[56] References Cited

U.S. PATENT DOCUMENTS 3,806,778  4/1974  Shimakura ........................ 257/406
5,289,030  2/1994  Yamazaki et al. ................ 257/66
5,561,075  10/1996 Nakazawa ....................... 437/983
5,568,288  10/1996 Yamazaki ......................... 359/59

FOREIGN PATENT DOCUMENTS 2306664  12/1990  Japan ............................... 257/352

Primary Examiner—John Niebling
Assistant Examiner—Brendan Mee
Attorney, Agent, or Firm—Sixbey Friedman Leedom & Ferguson; Gerald J. Ferguson, Jr.; Evan R. Smith

[57] ABSTRACT

A method for producing a thin-film transistor (TFT) in which the gate electrode is offset from the source and drain without detriment to the characteristics of the device or to manufacturing yield, and a structure for such a TFT, are disclosed. A gate electrode is formed using a material capable of anodic oxidation, and a mask is formed on the gate electrode. Using a comparatively low voltage, a comparatively thick, porous anodic oxide film is formed on the sides of the gate electrode. The mask is then removed and using a comparatively high voltage a dense anodic oxide film is formed at least on the top of the gate electrode. Using the gate electrode having this anodic oxide on its top and sides as a mask, an impurity is introduced into the semiconductor film and an offset structure is obtained.

20 Claims, 3 Drawing Sheets a: Present Invention
b: Prior Art

METHOD FOR PRODUCING A TRANSISTOR USING ANODIC OXIDATION

This is a Divisional application of Ser. No. 08/219,378, filed Mar. 29, 1994, now abandoned.

BACKGROUND OF THE INVENTION

1. Field of the Invention

The present invention relates to the structure and production method of a field effect transistor of thin-film insulator gate type (so-called thin-film transistor, abbreviated as TFT).

2. Description of the Prior Art

Thin-film devices such as field effect transistors of thin-film insulator gate type (TFT) have the known property that the source-drain leakage current is reduced if the gate electrode is offset from the source and drain regions. For the magnitude of this offset a high accuracy of the order of submicrons has been required. If the magnitude of the offset changes by for example more than 0.5 µm, the characteristics of the TFT change completely. Thus, appropriate control is required to achieve an accuracy of 0.1 µm or less, and preferably 500 Å or less. Such control, however, is not possible with photolithography.

As an approach to this problem, it has been proposed that an offset be obtained by forming a gate electrode from a material capable of anodic oxidation and anodically oxidizing the gate electrode to form an anodic oxide film thinner than 0.5 µm on it with an accuracy of 100 Å or better, and introducing impurities by ion doping or ion implantation with this as a mask. (Japanese Patent Application No. H.3-237100)

An example of a conventional TFT in which an anodic oxide film of this kind has been used is shown in FIG. 2. FIG. 2(E) is a top view of the TFT, FIG. 2(A) is a sectional view (a section perpendicular to the gate electrode) taken in the direction of the arrows A–A' in FIG. 2(E), and FIG. 2(C) is a sectional view (a section parallel to the gate electrode) taken in the direction of the arrows B–B' in FIG. 2(E).

On a substrate (22) and a base insulation film (23) is formed an island-shaped semiconductor film (24) having an active region (a channel-forming region) and impurity regions (source and drain), and a gate insulation film (25) is formed on top of that. On this gate insulation film is formed a gate electrode (26), and on periphery (the top and sides) of this there is an anodic oxide film (27).

Because impurities are introduced into the semiconductor film (24) after the periphery of the gate electrode has been anodically oxidized, as is clear from FIG. 2 the impurity regions (hatched area) and the gate electrode are separated by a distance equal to the thickness [x] of the anodic oxide film (i.e. the gate is offset). The anodic oxide film on the sides of the gate electrode has been necessary for creating the offset. In addition, because the anodic oxide film on the top surface is necessary in order to improve the insulation between the gate electrode interconnect and interconnects above it, the anodic oxide film there should be dense (non-porous) and be of high resistance.

It has been understood that in general the greater the magnitude of offset, the smaller the source-drain leakage current. For the leakage current to be sufficiently small, it has been necessary for the anodic oxide film to be made thicker than 0.2 µm, and preferably thicker than 0.4 µm.

However, to obtain a thick anodic oxide film like this a high anodization voltage has been necessary. Hitherto, the anodization voltage needed to obtain a 0.4 µm thick, non-porous anodic oxide film has been as high as 400V, but the voltage applied to the gate electrode at this time partly acts across the semiconductor film (24) and the gate electrode (26), and this has tended to cause permanent damage to the gate insulating film (25) and increase the density of interface levels. As a result, yields and reliability have been reduced.

Also, for example, when the gate electrode is made of aluminum, the formation of an anodic oxide film of 0.4 µm thickness involves the oxidation of aluminum of about 0.2 µm thickness; this has meant that the aluminum of the gate electrode has to be made thicker than 0.2 µm, and preferably thicker than 0.4 µm. For example, when the initial aluminum film thickness is made 0.4 µm and an anodic oxide film of 0.4 µm thickness is formed, an aluminum gate electrode of 0.2 µm thickness remains, as shown in FIG. 2(B), and as a result the total thickness of the gate electrode and the anodic oxide film becomes 0.6 µm. Generally, in order to obtain good yields, it is desirable that the step heights of gate interconnects and the like be made less than 0.5 µm, and in the above example this is exceeded. Furthermore, because the height of the actual interconnect is 0.2 microns, its resistance increases and the characteristics of the TFT deteriorate.

The present inventors have observed that in locations such as the stepped part (29) of the film shown in FIG. 2(D) the anodic oxidation of the film proceeds markedly rapidly and sometimes, as shown in FIG. 2(D), it is oxidized almost completely and the interconnect is substantially disconnected.

SUMMARY OF THE INVENTION

The present invention was devised in view of this kind of problem, and has among its objects that of improving the TFT reliability and yield by lowering the maximum anodization voltage and those of achieving an offset greater than 0.2 µm, and preferably greater than 0.5 µm, and making the height of the gate electrode and the anodic oxide as low as possible by selectively growing the anodic oxide film on the sides.

According to the present invention, the above-mentioned problems are solved by combining two kinds of anodic oxides, a porous one and a non-porous one. Specifically, in this invention, a porous anodic oxide film of thickness greater than 0.2 µm and preferably greater than 0.5 µm is formed on the sides of the gate electrode using a comparatively low voltage, and an insulating, non-porous anodic oxide film is formed on the top of the gate electrode.

The porous anodic oxide film is obtained by anodic oxidation carried out in a 3–20% aqueous solution of citric acid or oxalic acid, phosphoric acid, chromic acid, sulfuric acid or the like. The non-porous anodic oxide film, on the other hand, is obtained by anodic oxidation performed in a 3–10% solution of tartaric acid, boric acid, nitric acid or the like in an organic solvent such as ethylene glycol. It is desirable that the non-porous anodic oxide film formed on the top of the gate electrode be as thin as possible (as long as insulation from interconnects above is maintained), and it should be thinner than 0.2 µm and preferably thinner than 0.1 µm.

These two types of anodic oxide can be obtained by forming a mask on the top of the gate electrode and first forming the porous anodic oxide film, and then removing the mask and forming the non-porous anodic oxide film mainly on the top of the gate electrode. It is necessary that the mask used for this purpose withstand the anodization voltage, and for example polyimide and the like are suitable. In particular, if it is a photosensitive material such as "Photoneece" (photosensitive polyimide) or "AZ1350", the mask may be used for the patterning of the gate electrode.

The porous anodic oxide film may be used as it is without particular treatment; however, so-called sealing treatment may be performed to improve the insulation of the side surfaces.

The structure of the invention will now be explained in detail with reference to a preferred embodiment.

DESCRIPTION OF THE PREFERRED EMBODIMENTS

Figure 1A:
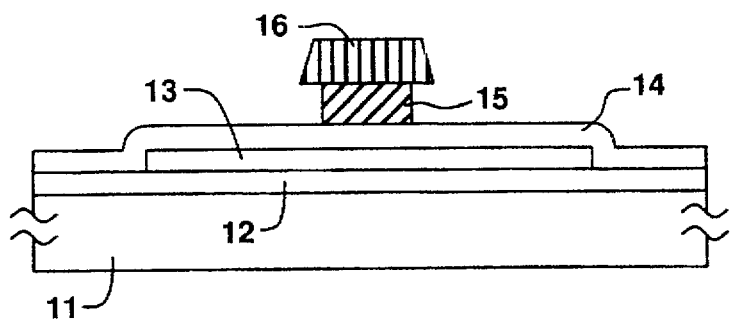
FIGS. 1(A) to 1(E) are sectional views illustrating a process for producing a TFT according to a preferred embodiment of the invention.
Figure 1B:
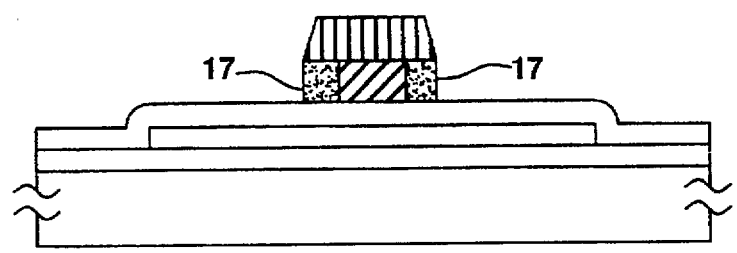
Figure 1C:
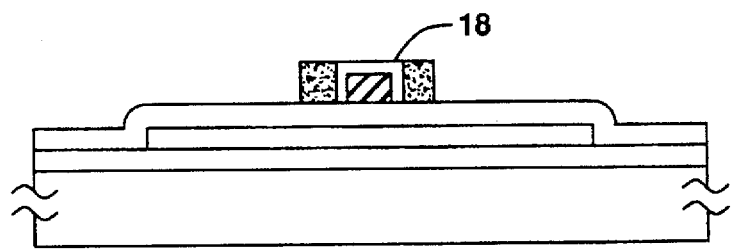
Figure 1D:
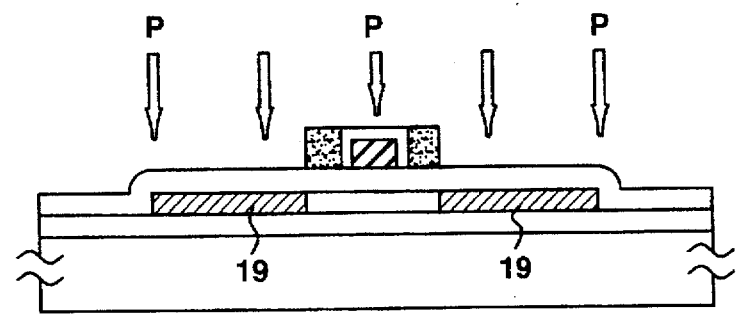
Figure 1E:
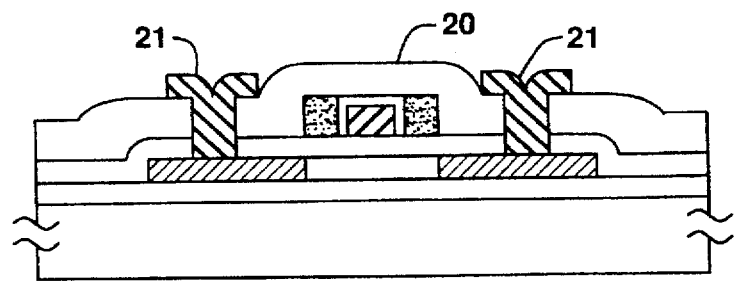
Figure 2A:
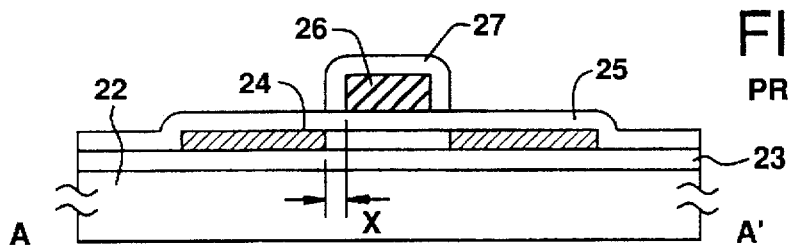
FIGS. 2(A) to 2(E) are sectional views illustrating an example of a conventional TFT and problems associated with it.
Figure 2B:
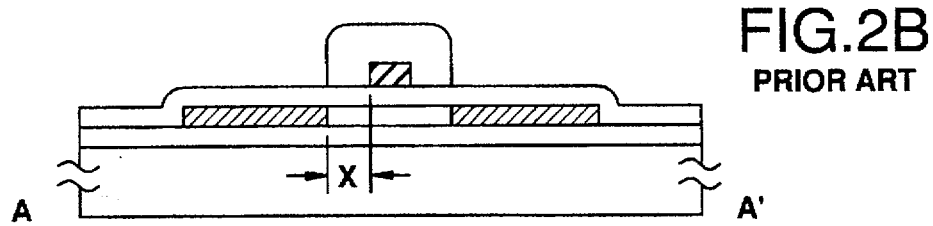
Figure 2C:
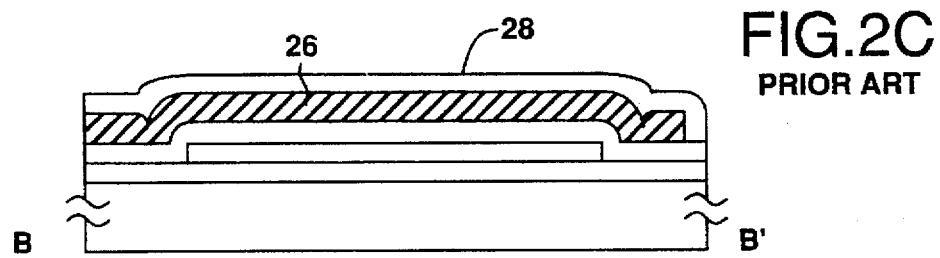
Figure 2D:
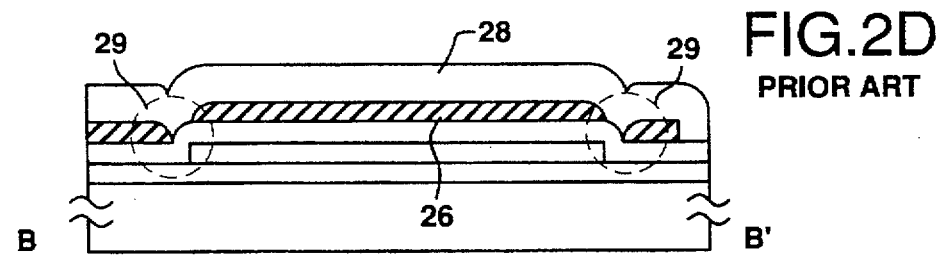
Figure 2E:
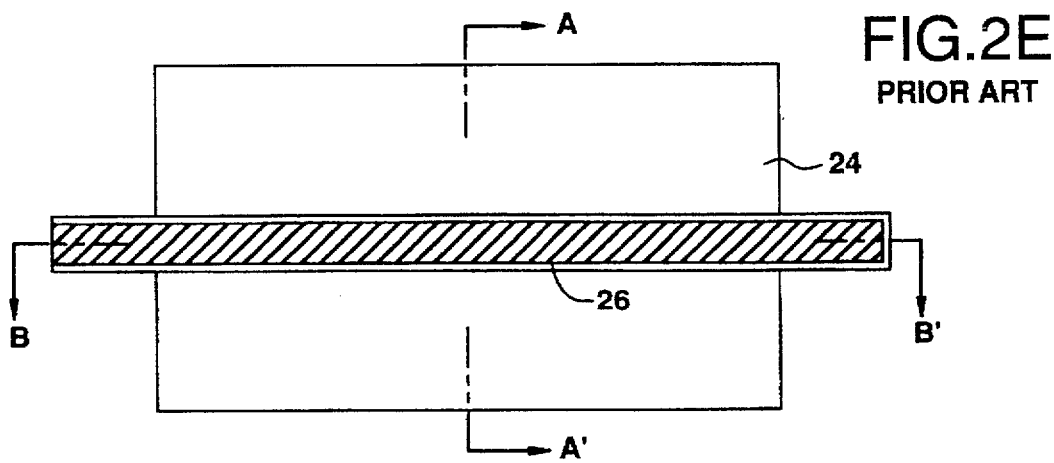

The process employed in this preferred embodiment is shown in sectional views in FIG. 1. First, a 2000 Å thick silicon oxide base film (12) was formed on a substrate (Corning 7059) (11) by sputtering. Then, an intrinsic (I type) amorphous silicon film 500–1500 Å thick, for example 1500 Å thick, was deposited by plasma CVD. Then, a 200 Å thick silicon oxide film was deposited by sputtering.

This amorphous silicon film was crystallized by annealing in nitrogen at 550° C. for 4 hours. After the annealing, the silicon film was patterned to make an island-shaped silicon region (13), and by sputtering a 1000 Å thick silicon oxide film (14) was deposited as a gate insulating film. In the sputtering, silicon oxide was used as the target, the substrate temperature during sputtering was 200°–400° C., for example 250° C., and the sputtering atmosphere was argon and oxygen in the ratio argon/oxygen=0 to 0.5, for example below 0.1.

Consecutively with this, an aluminum film (containing 1–3% silicon) 3000–5000 Å thick, for example 4000 Å thick, was deposited by sputtering. (It is desirable that the steps of forming the silicon oxide film and the aluminum film be carried out consecutively.) A photoresist having good voltage withstanding properties, such as Shipley Co.'s AZ1350, about 1 µm thick was formed on this aluminum film by spin coating. The photoresist was patterned by a known lithography process to form a gate electrode (15). The photoresist mask (16) remains on the gate electrode. Similar effects can be obtained using for example a photosensitive polyimide such as UR3800, made by Toray Industries Co., instead of the photoresist. (FIG. 1(A))

Then, by immersing the substrate in a 10% aqueous solution of citric acid and carrying out anodic oxidation at a constant voltage of 10–50V, for example 10V, for 10–50 minutes, for example 30 minutes, it was possible to form a porous anodic oxide film (17) about 3000 Å thick on the side of the gate electrode with a precision of 200 Å or better. Alternatively, the anodic oxidation may be carried out in an 8% oxalic acid solution at 30–40V. Because the mask was present on the top of the gate electrode, almost no anodic oxidization took place there at all. (FIG. 1(B))

Next, the mask was removed and the top of the gate electrode was exposed, the substrate was immersed in a 3% solution of tartaric acid in ethylene glycol (pH-adjusted to neutral with ammonia), and anodic oxidation was carried out by passing an electric current through this so that the voltage increased at a rate of 1–5 V/min, for example 4 V/min. In this process, anodic oxidation took place on the sides as well as the top of the gate electrode, and a dense anodic oxide film (18) of thickness 1000 Å was formed. The withstand voltage of this anodic oxide film was higher than 50V. (FIG. 1(C))

Next, the silicon region (13) was doped with an impurity (phosphorus) by plasma doping, with the gate electrode as a mask. Phosphine ($PH_3$) was used as the doping gas, and the accelerating voltage was 60–90 kV, for example 80 kV. The dose was $1\times10^{15}$ to $8\times10^{15}$ $cm^{-2}$, for example $2\times10^{15}$ $cm^{-2}$. In this way N-type impurity regions (19) were formed. (FIG. 1(D))

Next, the substrate was annealed by irradiation from the top surface with laser light to activate the doped impurity. A KrF excimer laser (wavelength 248 nm, pulse width 30 ns) was used as the laser, but a XeCl excimer laser (wavelength 308 nm), an ArF excimer laser (wavelength 193 nm), a XeF excimer laser (wavelength 353 nm) or the like may alternatively be used.

The energy density of the laser was 200–400 $mJ/cm^2$, for example 250 $mJ/cm^2$, and irradiation of 2–10 shots, for example 2 shots, was performed. For the laser irradiation, the substrate was heated to 200°–300° C., for example 250° C. In this way the impurity region (19) was activated.

Then, a silicon oxide film (20) of thickness 6000 Å was formed as an interlayer insulator by plasma CVD, contact holes were made in this, and electrodes/interconnects (21) for the source and drain regions of the TFT were formed with a multi-layer film of metallic material, for example titanium nitride and aluminum. Finally, annealing was performed in a hydrogen atmosphere at 1 atmosphere and at 350° C. for 30 minutes. By the above steps a thin-film transistor was obtained. (FIG. 1(E))

Figure 3:
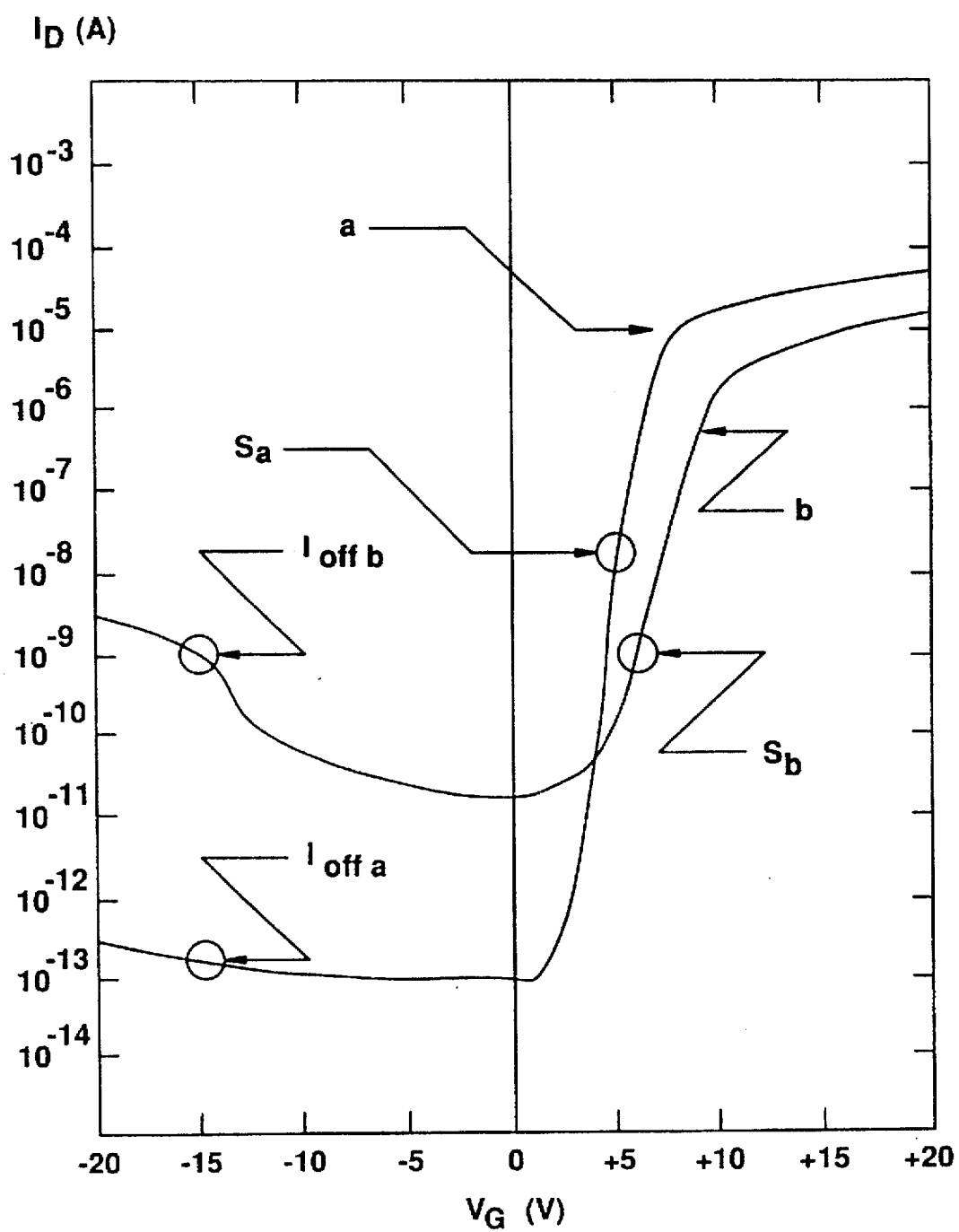
FIG. 3 shows the characteristics of a TFT produced according to the preferred embodiment of the present invention and the characteristics of a TFT produced by a conventional method.

FIG. 3 shows the characteristics of a TFT obtained according to this preferred embodiment and the characteristics of a TFT obtained by a conventional method (Japanese Patent Application No. H.3-237100). The TFT obtained by the conventional method was anodically oxidized in a 3% solution of tartaric acid in ethylene glycol (pH-adjusted to neutral with ammonia) with the voltage being increased to 220 V at a rate of 4 V/min. This resulted in a 2000 Å thick anodic oxide film being formed, with the offset being about 2000 Å. In the case of the TFT of the present preferred embodiment, on the other hand, the offset was as great as about 4000 Å (3000 Å of porous anodic oxide film plus 1000 Å of non-porous anodic oxide film), and as a result the leak current ($I_{OFF}$) was extremely low.

Moreover, because no excessive voltage was applied to the gate insulating film during the anodic oxidation, the interface level density of the gate insulating film was low; consequently the subthreshold characteristic (S value) of the TFT was extremely low, and as a result the steep rise characteristic shown in FIG. 3 was obtained.

When both of the TFT samples were tested for characteristic deterioration by the application of a long-duration bias voltage, the difference between the two became large, and, for example, after the source was grounded and a voltage of 25V was applied to the gate and drain for 100 hours, whereas the conventional TFT exhibited no characteristic at all, the TFT of the present preferred embodiment merely suffered a 20% decrease in ON-current and a 30% increase in leakage current.

As described in detail with reference to the above preferred embodiment, a TFT according to the present invention is superior to a conventional TFT in both reliability and characteristics. Also, because in a TFT according to the present invention the height of the gate electrode and anodic oxide film is kept down, it is less liable to pinholes and disconnection caused by steps, and consequently high yields can be obtained. Furthermore, there is no disconnection whatsoever of the gate interconnect during anodic oxidation. Thus, the present invention is of industrial value.

What is claimed is:

1. A process for producing a transistor comprising:
   forming a gate insulating film on a semiconductor region formed on a substrate;
   forming a first film capable of anodic oxidation on said gate insulating film;
   forming a second film on said first film;
   patterning said first film and said second film to form a gate electrode comprising a material of said first film and a mask comprising a material of said second film;
   forming an anodic oxide mainly on a side surface of said gate electrode by passing an electric current through said gate electrode with said mask remaining on said gate electrode;
   removing said mask;
   forming an anodic oxide at least on a top surface of said gate electrode by passing an electric current through said gate electrode after removing step; and
   introducing an impurity into said semiconductor region using as a mask said gate electrode and at least the anodic oxide formed on said side surface,
   wherein a thickness of the anodic oxide formed on the side surface is larger than that of the anodic oxide formed on the top surface.

2. The process of claim 1 wherein said first film comprises an electrically conductive material.

3. The process of claim 1 wherein said second film is made of a photosensitive organic material.

4. The process of claim 1 wherein said first film has a thickness of 3000 to 5000 Å.

5. The process of claim 1 further comprising the step of irradiating said semiconductor region with a laser light after said introducing step.

6. The process of claim 5 wherein said laser light is emitted from an excimer laser.

7. The process of claim 5 wherein said substrate is heated to a temperature of 200° to 300° C. during said irradiating step.

8. A method for producing a transistor comprising the steps of:
   forming an active region including a semiconductor material;
   forming a gate electrode including an anodizable material over the active region;
   forming a first anodic oxide on side and top surfaces of the gate electrode, and
   forming a second anodic oxide adjacent to the side surface of the gate electrode with the first anodic oxide interposed therebetween,
   wherein the second anodic oxide is more porous than the first anodic oxide.

9. The method of claim 8 wherein a thickness of the second anodic oxide is larger than that of the first anodic oxide.

10. A method for producing a transistor comprising the steps of:
    forming an active region including source and drain regions on a substrate;
    forming a gate electrode including an anodizable material over the active region; and
    forming an anodic oxide on side and top surfaces of the gate electrode, such that the anodic oxide is formed on the side surface with a thickness greater than a thickness of the anodic oxide formed on the top surface,
    wherein at least one of the source and drain region is offset from the gate electrode by the thickness of the anodic oxide formed on the side surface.

11. A method of manufacturing an insulated gate thin film transistor comprising the steps of:
    preparing a semiconductor island on an insulating surface;
    forming an insulating film on said semiconductor island for forming a gate insulating film;
    forming a conductive pattern over said semiconductor island with said insulating film therebetween, said conductive pattern comprising an anodizable metal;
    masking an upper surface of said conductive pattern with a mask;
    performing a first anodic oxidation to form a first anodic oxide film on side surfaces of said conductive pattern;
    removing said mask after the first anodic oxidation;
    performing a second anodic oxidation after removing said mask to form a second anodic oxide film on both the side and upper surfaces of said conductive pattern wherein said second anodic oxidation is conducted in a different condition from said first anodic oxidation so that said second anodic oxide film is interposed between the first anodic oxide film and said conductive pattern; and then
    introducing ions of a dopant impurity into portions of said semiconductor island, using as a mask said conductive pattern having the first and second anodic oxide films.

12. A method according to claim 11 wherein said semiconductor island comprises crystalline silicon.

13. A method according to claim 11 wherein said second anodic oxide film has a higher density than said first anodic oxide film.

14. A method according to claim 11 wherein said conductive pattern comprises aluminum.

15. A method according to claim 11 wherein said dopant impurity is phosphorous.

16. A method according to claim 11 wherein said ions are introduced into said semiconductor island through said insulating film.

17. A method of manufacturing an insulated gate thin film transistor comprising the steps of:
    preparing a semiconductor island on an insulating surface;
    forming an insulating film on said semiconductor island for forming a gate insulating film;
    forming a conductive pattern over said semiconductor island with said insulating film therebetween, said conductive pattern comprising an anodizable material;
    masking an upper surface of said conductive pattern with a mask;
    performing a first anodic oxidation to form a first anodic oxide film on side surfaces of said conductive pattern;
    performing a second anodic oxidation to form a second anodic oxide film on at least a side surface of said conductive pattern wherein said second anodic oxidation is conducted in a different condition from said first anodic oxidation so that said second anodic oxide film is interposed between the first anodic oxide film and said conductive pattern; and then introducing ions of a dopant impurity into portions of said semiconductor island with said conductive pattern having the first and second anodic oxide films used as a mask, wherein said first anodic oxide is more porous than said second anodic oxide film.

18. A method according to claim 17 wherein said conductive pattern comprises aluminum.

19. A method according to claim 17 wherein said dopant impurity is phosphorous.

20. A method according to claim 17 wherein said semiconductor island comprises crystalline silicon.

* * * * *